US010923426B2

(12) United States Patent
Fan et al.

(10) Patent No.: US 10,923,426 B2
(45) Date of Patent: Feb. 16, 2021

(54) STANDARD-CELL LAYOUT STRUCTURE WITH HORN POWER AND SMART METAL CUT

(71) Applicant: Taiwan Semiconductor Manufacturing Co., Ltd., Hsin-Chu (TW)

(72) Inventors: Ni-Wan Fan, Miao-Li County (TW); Ting-Wei Chiang, New Taipei (TW); Cheng-I Huang, Hsinchu (TW); Jung-Chan Yang, Longtan Township (TW); Hsiang-Jen Tseng, Hsinchu (TW); Lipen Yuan, Jhubei (TW); Chi-Yu Lu, New Taipei (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 0 days.

(21) Appl. No.: 16/057,875

(22) Filed: Aug. 8, 2018

(65) Prior Publication Data

US 2018/0350743 A1    Dec. 6, 2018

Related U.S. Application Data

(62) Division of application No. 15/170,246, filed on Jun. 1, 2016, now Pat. No. 10,672,708.

(Continued)

(51) Int. Cl.
*H01L 23/528* (2006.01)
*H01L 27/088* (2006.01)
(Continued)

(52) U.S. Cl.
CPC .... *H01L 23/5286* (2013.01); *H01L 21/76805* (2013.01); *H01L 21/76816* (2013.01);
(Continued)

(58) Field of Classification Search
CPC .............. H01L 23/528; H01L 23/5286; H01L 23/5228; H01L 23/5226; H01L 23/5221
See application file for complete search history.

(56) References Cited

U.S. PATENT DOCUMENTS 6,246,118 B1    6/2001 Buynoski
6,525,419 B1    2/2003 Deeter et al.
(Continued)

FOREIGN PATENT DOCUMENTS

JP    2008047791 A    2/2008

OTHER PUBLICATIONS

Non-Final Office Action dated Apr. 19, 2017 for U.S. Appl. No. 15/170,246.
(Continued)

*Primary Examiner* — Jesse Y Miyoshi
(74) *Attorney, Agent, or Firm* — Eschweiler & Potashnik, LLC

(57) ABSTRACT

The present disclosure, in some embodiments, relates to a method of forming an integrated circuit. The method is performed by forming a gate structure over a substrate, and selectively implanting the substrate according to the gate structure to form first and second source/drain regions on opposing sides of the gate structure. A first MEOL structure is formed on the first source/drain region and a second MEOL structure is formed on the second source/drain region. The first MEOL structure has a bottommost surface that extends in a first direction from directly over the first source/drain region to laterally past an outermost edge of the first source/drain region. A conductive structure is formed to contact the first MEOL structure and the second MEOL structure. The conductive structure laterally extends from (Continued)

directly over the first MEOL structure to directly over the second MEOL structure along a second direction perpendicular to the first direction.

20 Claims, 12 Drawing Sheets

Related U.S. Application Data

(60) Provisional application No. 62/260,965, filed on Nov. 30, 2015.

(51) Int. Cl.
*H01L 23/485* (2006.01)
*H01L 21/8234* (2006.01)
*H01L 21/768* (2006.01)
*H01L 23/535* (2006.01)
*H01L 27/118* (2006.01)
*H01L 27/02* (2006.01)
*H01L 29/66* (2006.01)

(52) U.S. Cl.
CPC ............ *H01L 21/76895* (2013.01); *H01L 21/823425* (2013.01); *H01L 23/485* (2013.01); *H01L 23/535* (2013.01); *H01L 27/0207* (2013.01); *H01L 27/088* (2013.01); *H01L 29/66545* (2013.01); *H01L 21/823475* (2013.01); *H01L 27/0886* (2013.01); *H01L 27/11807* (2013.01)

(56) References Cited

U.S. PATENT DOCUMENTS

| | | | |
|---|---|---|---|
| 8,618,607 B1* | 12/2013 | Rashed | H01L 27/0207 257/359 |
| 2002/0155662 A1 | 10/2002 | Asano et al. | |
| 2003/0151131 A1 | 8/2003 | Deeter et al. | |
| 2010/0065921 A1 | 3/2010 | Chuang et al. | |
| 2011/0073955 A1 | 3/2011 | Pendharkar et al. | |
| 2012/0132964 A1* | 5/2012 | Shima | H01L 23/4824 257/211 |
| 2012/0155662 A1 | 6/2012 | Tawada | |
| 2012/0261749 A1 | 10/2012 | Yamada | |
| 2013/0146986 A1 | 6/2013 | Rashed et al. | |
| 2014/0131860 A1* | 5/2014 | Kanda | H01L 23/481 257/737 |
| 2015/0194427 A1 | 7/2015 | Sengupta et al. | |

OTHER PUBLICATIONS

Non-Final Office Action dated Nov. 22, 2017 for U.S. Appl. No. 15/170,246.

Final Office Action dated May 25, 2018 for U.S. Appl. No. 15/170,246.

* cited by examiner

STANDARD-CELL LAYOUT STRUCTURE WITH HORN POWER AND SMART METAL CUT

REFERENCE TO RELATED APPLICATIONS

This Application is a Divisional of U.S. application Ser. No. 15/170,246 filed on Jun. 1, 2016, which claims priority to U.S. Provisional Application No. 62/260,965 filed on Nov. 30, 2015. The contents of the above-referenced Applications are hereby incorporated by reference in their entirety.

BACKGROUND

Over the last four decades the semiconductor fabrication industry has been driven by a continual demand for greater performance (e.g., increased processing speed, memory capacity, etc.), a shrinking form factor, extended battery life, and lower cost. In response to this demand, the industry has continually reduced a size of semiconductor device components, such that modern day integrated chips may comprise millions or billions of semiconductor devices arranged on a single semiconductor die.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
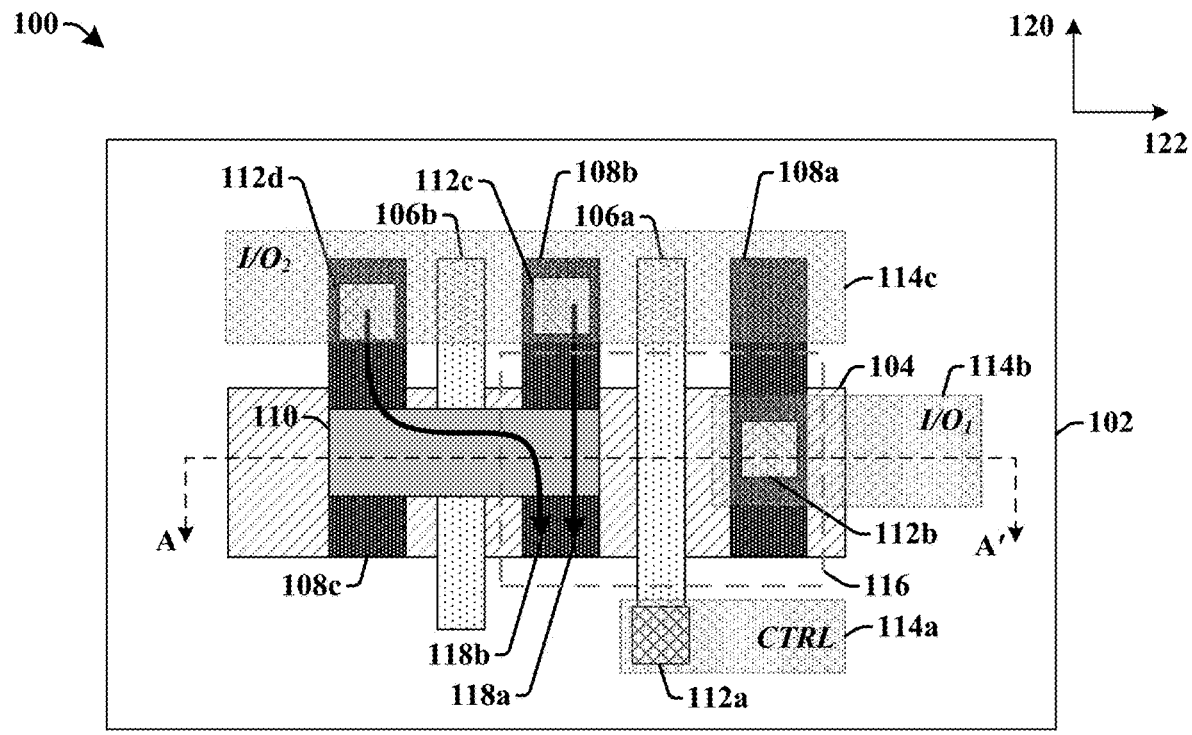
FIG. 1 illustrates a top-view of some embodiments of an integrated circuit having a power horn structure configured to reduce parasitic resistance.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In emerging technology nodes, the small size of transistor components may cause restrictive topology choices for routing back-end-of-the-line (BEOL) metal interconnect layers. To alleviate metal interconnect routing problems, middle-end-of-the-line (MEOL) local interconnect layers may be used. MEOL local interconnect layers are conductive (e.g., metal) layers that are vertically positioned between the front-end-of-line (FEOL) and the BEOL. MEOL local interconnect layers can provide very high-density local routing that avoids consumption of scarce routing resources on the lower BEOL metal interconnect layers.

Typically, MEOL local interconnect layers comprise MEOL structures that are formed directly onto an active area (e.g., a source/drain region). Conductive contacts are subsequently formed onto some of the MEOL structures to form an electrical connection with an overlying BEOL metal interconnect layers. It has been appreciated that in emerging technology nodes (e.g., 14 nm, 10 nm, 7 nm, etc.) the small size of MEOL structures and/or the conductive contacts is becoming small enough to be a significant source of parasitic resistance. The parasitic resistance can cause a drop in voltage and/or current (e.g., between a source voltage $V_{DD}$ or ground voltage $V_{SS}$ and a transistor source/drain region) that degrades transistor device performance.

In some embodiments, the present disclosure relates to an integrated circuit having parallel conductive paths between a BEOL interconnect layer and a MEOL structure, which are configured to reduce a parasitic resistance and/or capacitance of the integrated circuit. The integrated circuit comprises source/drain regions arranged within a semiconductor substrate and separated by a channel region. A first gate structure is arranged over the channel region, and a middle-end-of-the-line (MEOL) structure is arranged over one of the source/drain regions. A conductive structure is arranged over and in electrical contact with the MEOL structure. A first conductive contact is arranged between the MEOL structure and an overlying BEOL interconnect wire (e.g., a power rail). A second conductive contact is configured to electrically couple the BEOL interconnect wire and the MEOL structure along a conductive path extending through the conductive structure, so as to form parallel conductive paths extending between the BEOL interconnect layer and the MEOL structure. The parallel conductive paths have an increased cross-sectional area (compared to a single conductive path) for current to pass from the BEOL interconnect layer to the MEOL structure (i.e., a semiconductor device), thereby reducing a parasitic resistance of the device.

FIG. 1 illustrates a top-view of some embodiments of an integrated circuit 100 having a power horn structure configured to reduce parasitic resistance.

The integrated circuit 100 comprises a plurality of gate structures 106a-106b arranged over an active area 104 within a semiconductor substrate 102. In some embodiments, the plurality of gate structures comprise an electrically active gate structure 106a and a dummy gate structure 106b (i.e., an electrically inactive gate structure). The electrically active gate structure 106a is coupled to an overlying first BEOL metal interconnect wire 114a comprising a control node CTRL (e.g., a control voltage) by way of a first conductive contact 112a. The electrically active gate structure 106a is configured to control a flow of charge carriers within a transistor device 116 comprising the active area 104. In some embodiments, the plurality of gate structures 106a-106b extend along the first direction 120, and the active area 104 extends along a second direction 122 that is perpendicular to the first direction 120. In some embodiments, the active area 104 includes at least one fin, together with the plurality of gate structures 106a-106b, to form FinFET transistors.

A plurality of middle-end-of-the-line (MEOL) structures 108a-108c are interleaved between the plurality of gate structures 106a-106b. The plurality of MEOL structures comprise a first MEOL structure 108a and a second MEOL structure 108b configured to provide electrical connections to the active area 104. In some embodiments, the first MEOL structure 108a is coupled to an overlying second BEOL metal interconnect wire 114b comprising a first input/output node I/O$_1$ by way of a second conductive contact 112b. The second MEOL structure 108b is coupled to an overlying third BEOL metal interconnect wire 114c comprising a second input/output node I/O$_2$ by way of a third conductive contact 112c. The third conductive contact 112c forms a first conductive path 118a (i.e., electrical connection) between the third BEOL metal interconnect wire 114c and the second MEOL structure 108b.

A conductive structure 110 is arranged over the second MEOL structure 108b. A fourth conductive contact 112d forms a second conductive path 118b between the third BEOL metal interconnect wire 114c and the second MEOL structure 108b by way of the conductive structure 110. In some embodiments, the plurality of MEOL structures comprise a third MEO structure 108c separated from the second MEOL structure 108b by the dummy gate structure 106b. In some such embodiments, the third and fourth conductive contacts, 112c and 112d, are connected directly from the third BEOL metal interconnect wire 114c to the second MEOL structure 108b and the third MEOL structure 108c, respectively. In other such embodiments, the third and fourth conductive contacts, 112c and 112d, are connected directly to the conductive structure 110. In some embodiments, the conductive structure 110 extends over the dummy gate structure 106b.

Therefore, the conductive structure 110 provides for first and second conductive paths, 118a and 118b, which extend in parallel between the third BEOL metal interconnect wire 114c and the second MEOL structure 108b. The parallel conductive paths, 118a and 118b, provide for an increased cross-sectional area (compared to a single conductive path) for current to pass from the third BEOL metal interconnect wire 114c to the transistor device 116, thereby reducing a parasitic resistance of the transistor device 116.

Figure 2A:
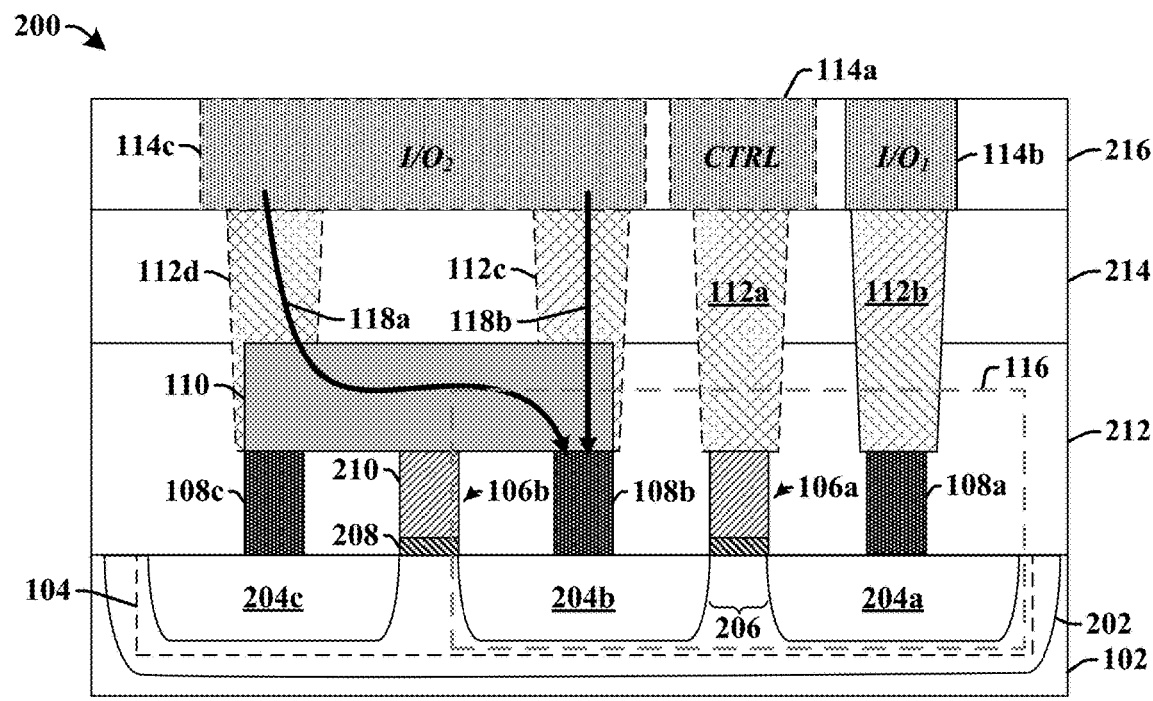
FIGS. 2A-2B illustrate cross-sectional views of some embodiments of an integrated circuit having a power horn structure configured to reduce parasitic resistance.

FIG. 2A illustrates a cross-sectional view (shown along cross-sectional line A-A' of FIG. 1)) of some embodiments of an integrated circuit 200 having a power horn structure configured to reduce parasitic resistance.

The integrated circuit 200 comprises an active area 104 having a plurality of source/drain regions 204a-204c arranged within a semiconductor substrate 102. In some embodiments, the active area 104 may be included within a well region 202 having a doping type opposite the semiconductor substrate 102 and the source/drain regions 204a-204c (e.g., a PMOS active area formed within a p-type substrate may comprise p-type source/drain regions arranged within an n-well). The plurality of source/drain regions 204a-204c comprise highly doped regions (e.g., having a doping concentration greater than that of the surrounding semiconductor substrate 102). In some embodiments, the plurality of source/drain regions 204a-204c are epitaxial source/drain regions. In some embodiments, the active area 104 includes at least one fin, protruding outward from the semiconductor substrate 102, to form FinFET transistors.

A plurality of gate structures 106a-106b are arranged over the semiconductor substrate 102 at locations laterally between the plurality of source/drain regions 204a-204c. The plurality of gate structures 106a-106b comprise an active gate structure 106a and a dummy gate structure 106b. The active gate structure 106a is configured to control the flow of charge carriers within a channel region 206 arranged between the first source/drain region 204a and a second source/drain region 204b during operation of a transistor device 116, while the dummy gate structure 106b is not. In some embodiments, the plurality of gate structures 106a-106b may comprise a gate dielectric layer 208 and an overlying gate electrode layer 210. In various embodiments, the gate dielectric layer 208 may comprise an oxide or a high-k dielectric layer. In various embodiments, the gate electrode layer 210 may comprise polysilicon or a metal (e.g., aluminum).

A plurality of MEOL structures 108a-108c are laterally interleaved between the plurality of gate structures 106a-106b. The plurality of MEOL structures 108a-108c are arranged over the source/drain regions 204a-204c and, in some embodiments, have heights that are substantially equal to heights of the plurality of gate structures 106a-106b (i.e., upper surfaces of the plurality of MEOL structures 108a-108c are substantially co-planar with upper surfaces of the gate electrode layer 210). In some embodiments, the heights of the MEOL structures 108a-108c are larger than heights of the plurality of gate structures 106a-106b. The plurality of MEOL structures 108a-108c may comprise a conductive material such as aluminum, copper, and/or tungsten, for example. In some embodiments, the plurality of MEOL structures 108a-108c and the plurality of gate structures 106a-106b are arranged at a substantially regular pitch (i.e., a spacing is substantially the same between left edges of the gate structures or between right edges of the gate structure). For example, the regular pitch may have values that vary due to misalignment errors by approximately 5% (e.g., a first pitch may be between 0.95 and 1.05 times a second pitch).

A conductive structure 110 is arranged over a second MEOL structure 108b of the plurality of MEOL structures 108a-108b. The conductive structure 110 has a lower surface that contacts an upper surface of the second MEOL structure 108b. In some embodiments, the lower surface of the conductive structure 110 also contacts an upper surface of a dummy gate structure 106b and/or a third MEOL structure 108c. The conductive structure 110 is arranged within an inter-level dielectric (ILD) layer 212. In some embodiments, the ILD layer 212 may comprise more than one dielectric layer.

A third conductive contact 112c and a fourth conductive contact 112d are arranged within a first inter-metal dielectric (IMD) layer 214 overlying the ILD layer 212. The third conductive contact 112c and a fourth conductive contact 112d are configured to couple the second MEOL structure 108b to a third BEOL metal interconnect wire 114c arranged within a second IMD layer 216 overlying the first IMD layer 214. In some embodiments, the third BEOL metal interconnect wire 114c may comprise copper or a copper alloy. In some embodiments, the third and fourth conductive contacts, 112c and 112d, are arranged along an upper surface of the second and third MEOL structures, 108b and 108c, respectively. In other embodiments, the third and fourth conductive contacts, 112c and 112d, are arranged along an upper surface of the conductive structure 110. The third conductive contact 112c is configured to provide current from the third BEOL metal interconnect wire 114c to the second MEOL structure 108b along a first conductive path 118a and the second conductive contact 112b is configured to provide current from the third BEOL metal interconnect wire 114c to the second MEOL structure 108b along a second conductive path 118b that is parallel to the first conductive path 118a.

Figure 2B:
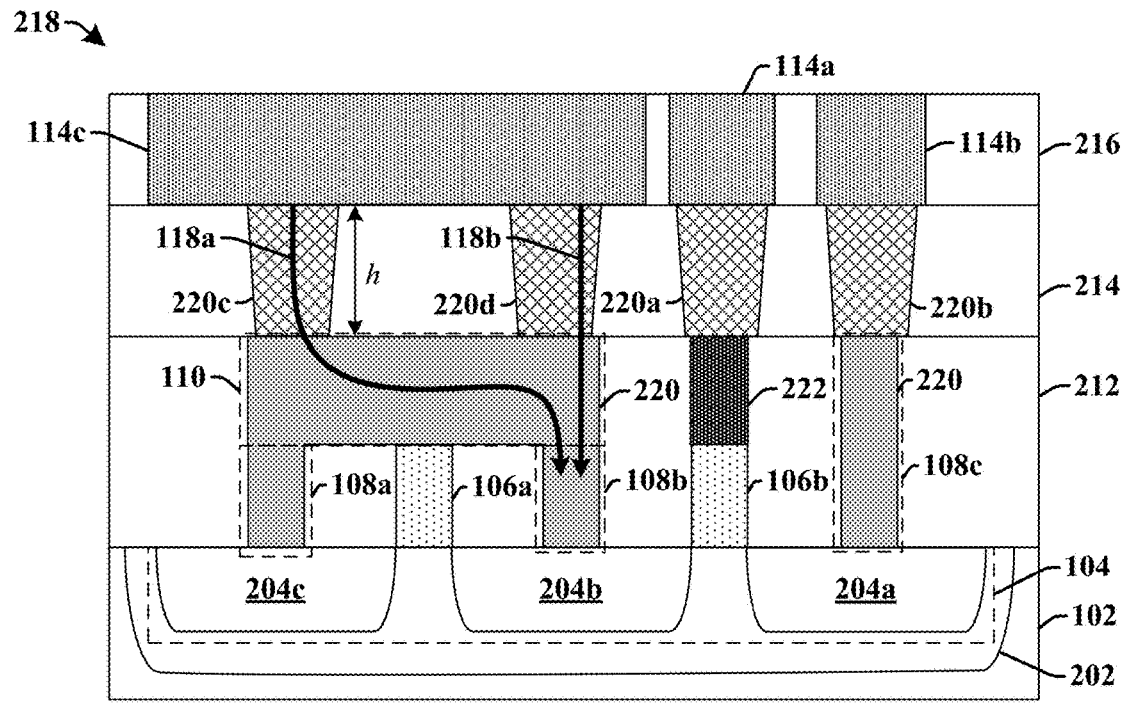

Although FIG. 2A illustrates a cross-sectional view of an integrated circuit 200 comprising MEOL structures 108a-108b having different materials (shading) than the conductive structure 110, it will be appreciated that this is a non-limiting embodiment. For example, FIG. 2B illustrates some alternative embodiments of an integrated circuit 218 having two different MEOL layers. A first MEOL layer 220 extends vertically between the semiconductor substrate 102 and conductive contacts 220b-220d, and includes the MEOL structures 108a-108c and the conductive structure 110. A second MEOL layer 222 extends vertically between a top of the active gate structure 106a and conductive contact 220a. In such embodiments, the conductive contacts 220a-220d have a height h that is less than a height of conductive contacts 112a-112d, illustrated in FIG. 2A.

Figure 3:
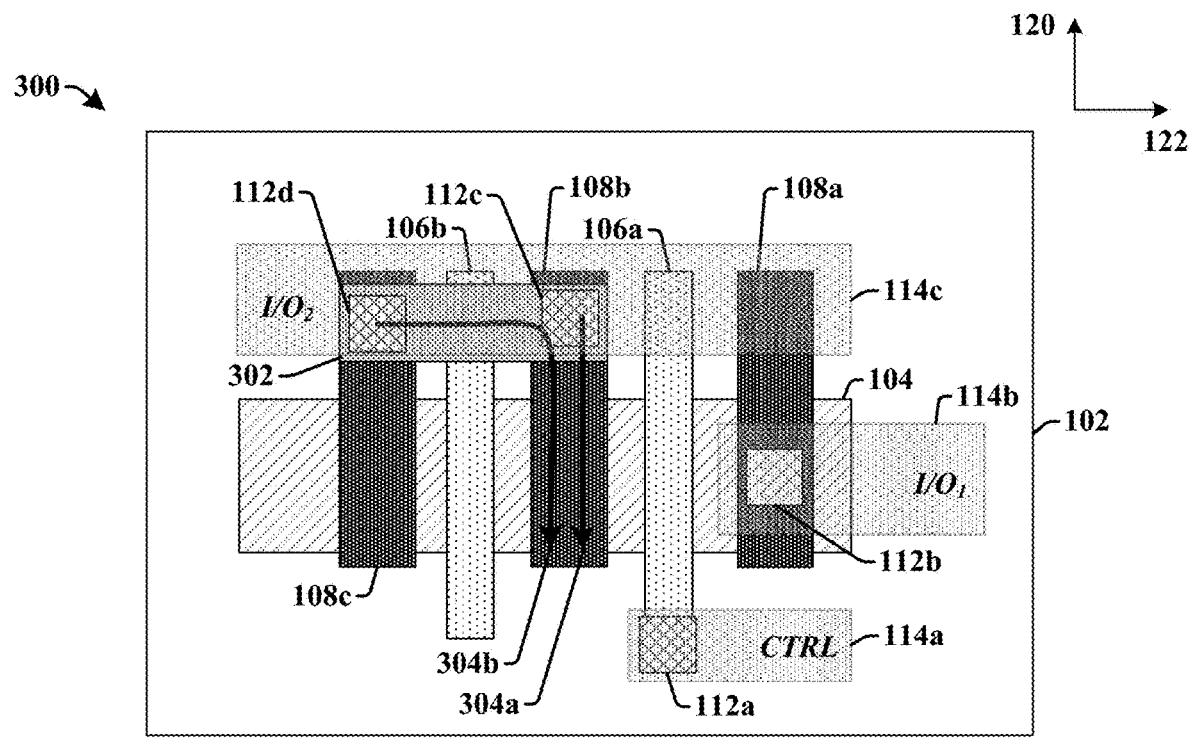
FIGS. 3, 4, 5, 6, 7A, 7B illustrate some additional embodiments of integrated circuits having a power horn structure.

FIG. 3 illustrates some additional embodiments of an integrated circuit 300 having a power horn structure configured to reduce parasitic resistance.

The integrated circuit 300 comprises a plurality of MEOL structures 108a-108c extending over an active area 104 in a first direction 120 and interleaved between a plurality of gate structures 106a-106b along a second direction 122. In some embodiments, the active area 104 may include at least one fin, protruding outward from a semiconductor substrate 102, to form FinFET transistors. The plurality of MEOL structures comprise a first MEOL structure 108a, a second MEOL structure 108b, and a third MEOL structure 108c. In some embodiments, the plurality of MEOL structures 108a-108c may straddle opposing edges of the active area 104 along the first direction 120. A conductive structure 302 is arranged over the second and third MEOL structures, 108b and 108c, at a location that is offset from the active area 104 in the first direction 120. The conductive structure 302 is coupled to a third BEOL metal interconnect wire 114c by way of a third conductive contact 112c, thereby providing a first conductive path 304a between the third BEOL metal interconnect wire 114c and the second MEOL structure 108b. The conductive structure 302 is also coupled to the third BEOL metal interconnect wire 114c by way of a fourth conductive contact 112d, thereby providing for a second conductive path 304b between the third BEOL metal interconnect wire 114c and the second MEOL structure 108b.

Figure 4:
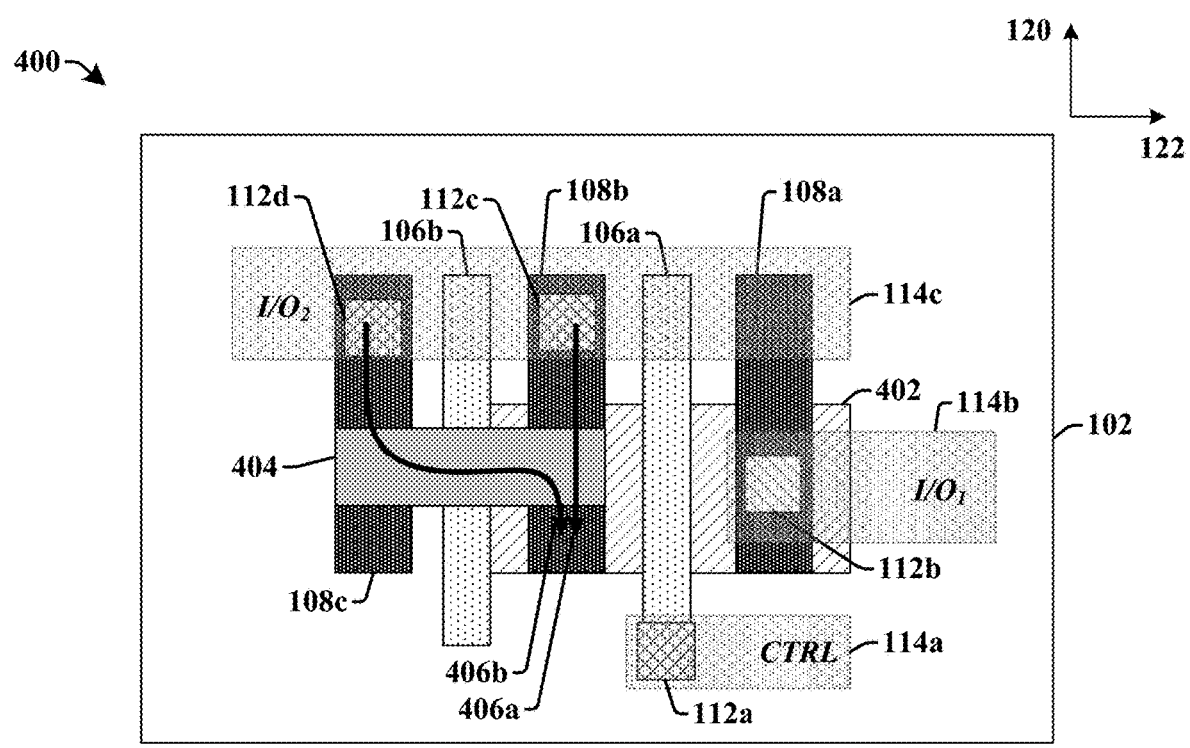

FIG. 4 illustrates some additional embodiments of an integrated circuit 400 having a power horn structure configured to reduce parasitic resistance.

The integrated circuit 400 comprises a plurality of MEOL structures 108a-108c interleaved between a plurality of gate structures 106a-106b along a second direction 122. The plurality of MEOL structures comprise a first MEOL structure 108a and a second MEOL structure 108b arranged over an active area 402, and a third MEOL structure 108c arranged at a location offset from the active area 402 along the second direction 122. In some embodiments, the active area 402 may include at least one fin, protruding outward from a semiconductor substrate 102, to form FinFET transistors. A conductive structure 404 straddles an end of the active area 402 and extends between the second MEOL structure 108b and the third MEOL structure 108c. In some embodiments, the conductive structure 404 extends over a dummy gate structure 106b. The second MEOL structure 108b is coupled to a third BEOL metal interconnect wire 114c by way of a third conductive contact 112c, thereby providing a first conductive path 406a between the third BEOL metal interconnect wire 114c and the second MEOL structure 108b. The third MEOL structure 108c is coupled to the third BEOL metal interconnect wire 114c by way of a fourth conductive contact 112d, thereby providing a second conductive path 406b between the third BEOL metal interconnect wire 114c and the second MEOL structure 108b that extends through the conductive structure 404.

Figure 5:
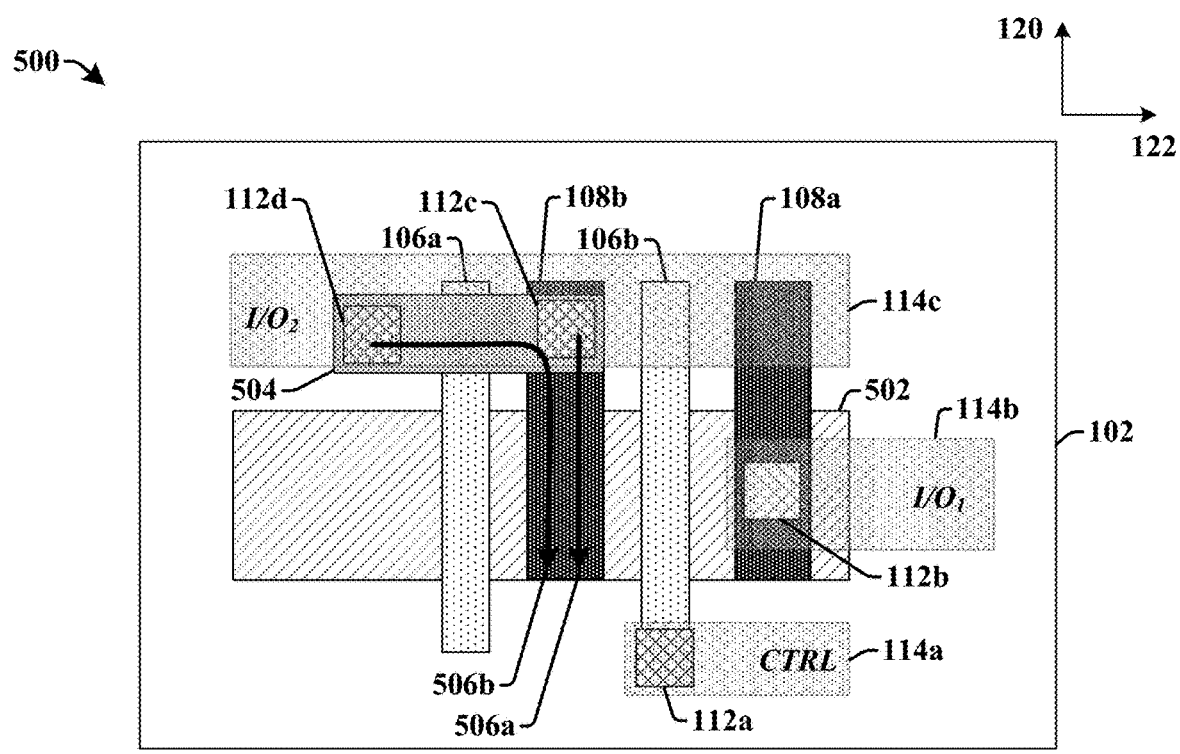

FIG. 5 illustrates some additional embodiments of an integrated circuit 500 having a power horn structure configured to reduce parasitic resistance.

The integrated circuit 500 comprises a plurality of MEOL structures 108a-108b extending over an active area 502 in a first direction 120 and interleaved between a plurality of gate structures 106a-106b along a second direction 122. In some embodiments, the active area 502 may include at least one fin, protruding outward from a semiconductor substrate 102, to form FinFET transistors. The plurality of MEOL structures 108a-108b comprise a first MEOL structure 108a and a second MEOL structure 108b. A conductive structure 504 is arranged over the second MEOL structure 108b at a location that is offset from the active area 502 in the first direction 120. The active area 502 extends past the conductive structure 504 in the second direction 122. The conductive structure 504 is coupled to a third BEOL metal interconnect wire 114c by way of a third conductive contact 112c, thereby providing a first conductive path 506a between the third BEOL metal interconnect wire 114c and the second MEOL structure 108b. The conductive structure 504 is also coupled to the third BEOL metal interconnect wire 114c by way of a fourth conductive contact 112d, thereby providing for a second conductive path 506b between the third BEOL metal interconnect wire 114c and the second MEOL structure 108b.

Figure 6:
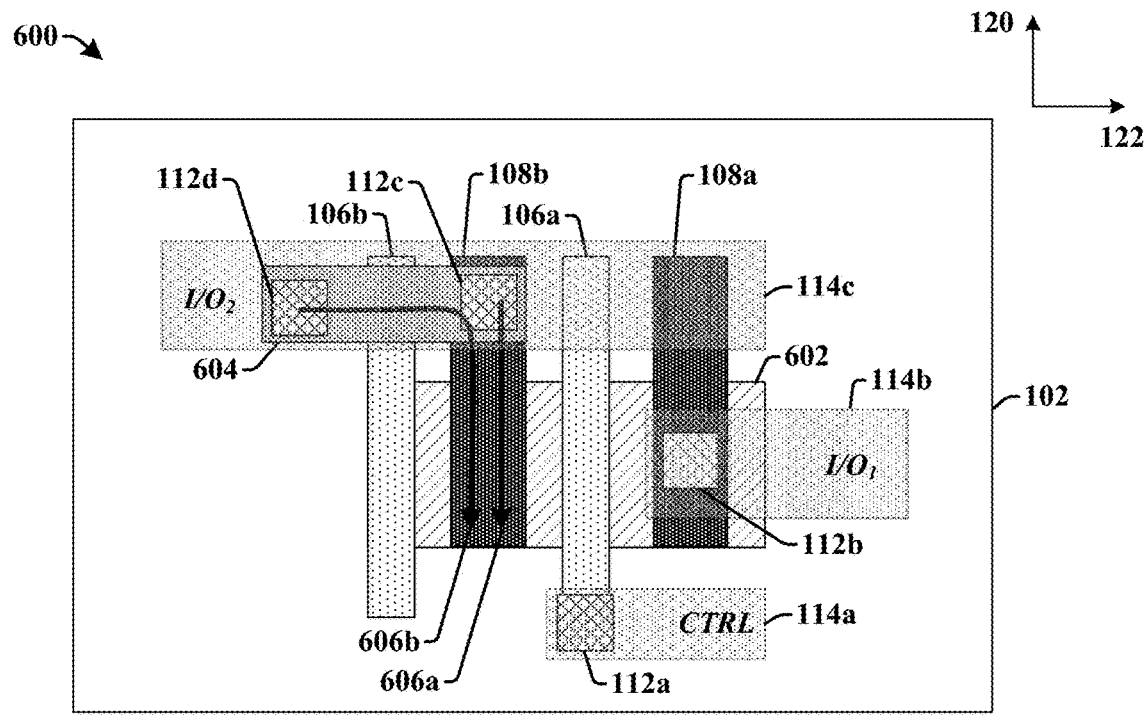

FIG. 6 illustrates some additional embodiments of an integrated circuit 600 having a power horn structure configured to reduce parasitic resistance.

The integrated circuit 600 comprises a plurality of MEOL structures 108a-108b interleaved between a plurality of gate structures 106a-106b along a second direction 122. The plurality of MEOL structures comprise a first MEOL structure 108a and a second MEOL structure 108b arranged over an active area 602. In some embodiments, the active area 602 may include at least one fin, protruding outward from a semiconductor substrate 102, to form FinFET transistors. A conductive structure 604 is arranged over the second MEOL structure 108b at a location that is offset from the active area 602 in a first direction 120. The conductive structure 604 extends past the active area 602 in the second direction 122. The conductive structure 604 is coupled to a third BEOL metal interconnect wire 114c by way of a third conductive contact 112c, thereby providing a first conductive path 606a between the third BEOL metal interconnect wire 114c and the second MEOL structure 108b. The conductive structure 604 is also coupled to the third BEOL metal interconnect wire 114c by way of a fourth conductive contact 112d, thereby providing for a second conductive path 606b between the third BEOL metal interconnect wire 114c and the second MEOL structure 108b.

Figure 7A:
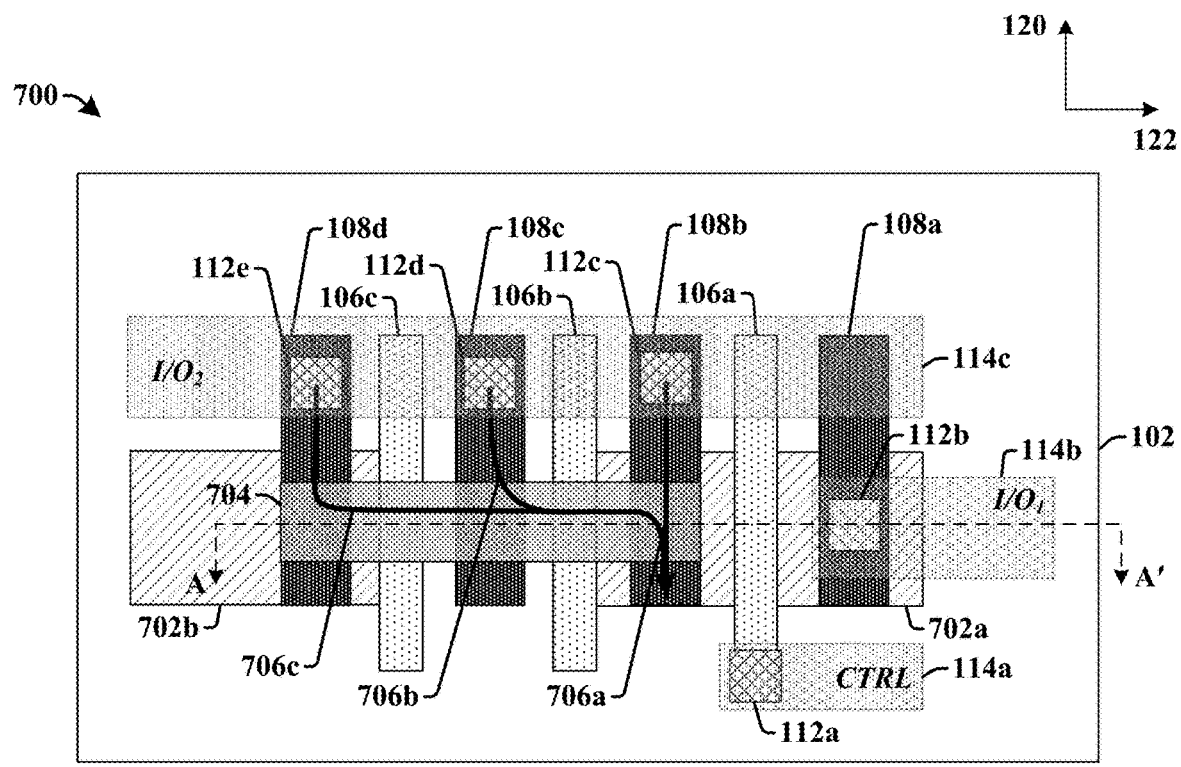
Figure 7B:
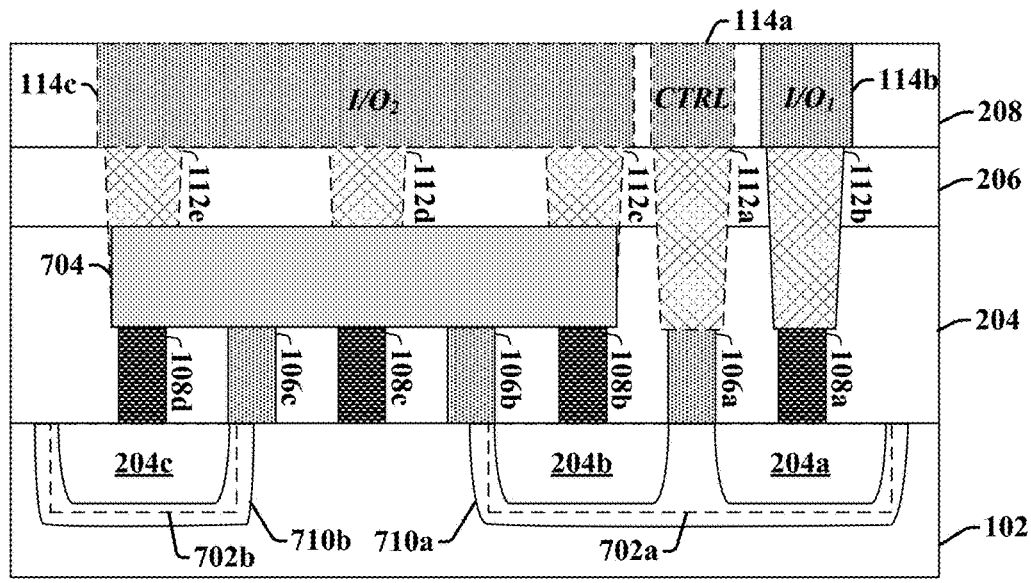

FIG. 7A illustrates a top-view of some additional embodiments of an integrated circuit 700 having a power horn structure configured to reduce parasitic resistance. FIG. 7B illustrates a cross-sectional view 708 shown along cross-sectional line A-A' of the integrated circuit 700 of FIG. 7A.

As shown in FIG. 7A, the integrated circuit 700 comprises a plurality of MEOL structures 108a-108d interleaved between a plurality of gate structures 106a-106c along a second direction 122. The plurality of MEOL structures comprise a first MEOL structure 108a and a second MEOL structure 108b arranged over a first active area 702a, a third MEOL structure 108c arranged at a location offset from the first active area 702a along the second direction 122, and a fourth MEOL structure 108d arranged over a second active area 702b. In some embodiments, the first active area 702a is included within a first well region 710a and the second active area 702b is included in a second well region 710b. In some embodiments, the first active area 702a and/or the second active area 702b may include at least one fin, protruding outward from a semiconductor substrate 102, to form FinFET transistors. A conductive structure 704 extends from over the first active area 702a to over the second active area 702b. The conductive structure 704 is arranged over the second MEOL structure 108b, the third MEOL structure 108c, and the fourth MEOL structure 108d.

In some embodiments, the conductive structure 704 extends over multiple dummy gate structures, 106b and 106c. In some embodiments, the second MEOL structure 108b is coupled to a third BEOL metal interconnect wire 114c by way of a third conductive contact 112c to provide a first conductive path 706a between the third BEOL metal interconnect wire 114c and the second MEOL structure 108b, the third MEOL structure 108c is coupled to the third BEOL metal interconnect wire 114c by way of a fourth conductive contact 112d to provide a second conductive path 706b between the third BEOL metal interconnect wire 114c and the second MEOL structure 108b that extends through the conductive structure 704, and the fourth MEOL structure 108d is coupled to the third BEOL metal interconnect wire 114c by way of a fifth conductive contact 112e to provide a third conductive path 706c between the third BEOL metal interconnect wire 114c and the second MEOL structure 108b that extends through the conductive structure 704. In other embodiments, the third conductive contact 112c, the fourth conductive contact 112d, and the fifth conductive contact 112e may be connected directly to the conductive structure 704.

Figure 8A:
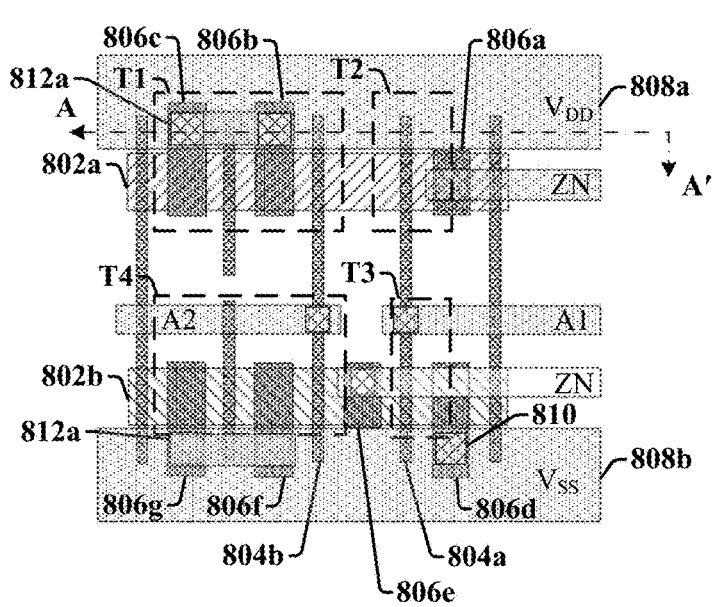
FIGS. 8A-8C illustrates some embodiments of a NOR gate having a power horn structure configured to reduce parasitic resistance.
Figure 8B:
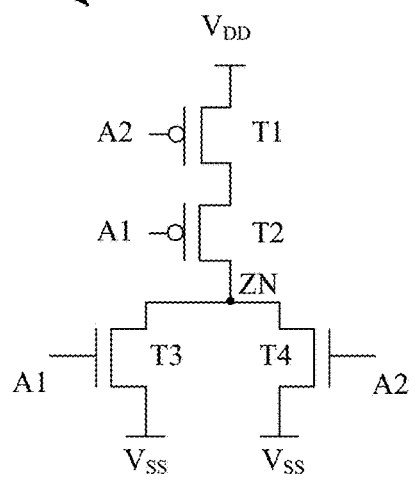
Figure 8C:
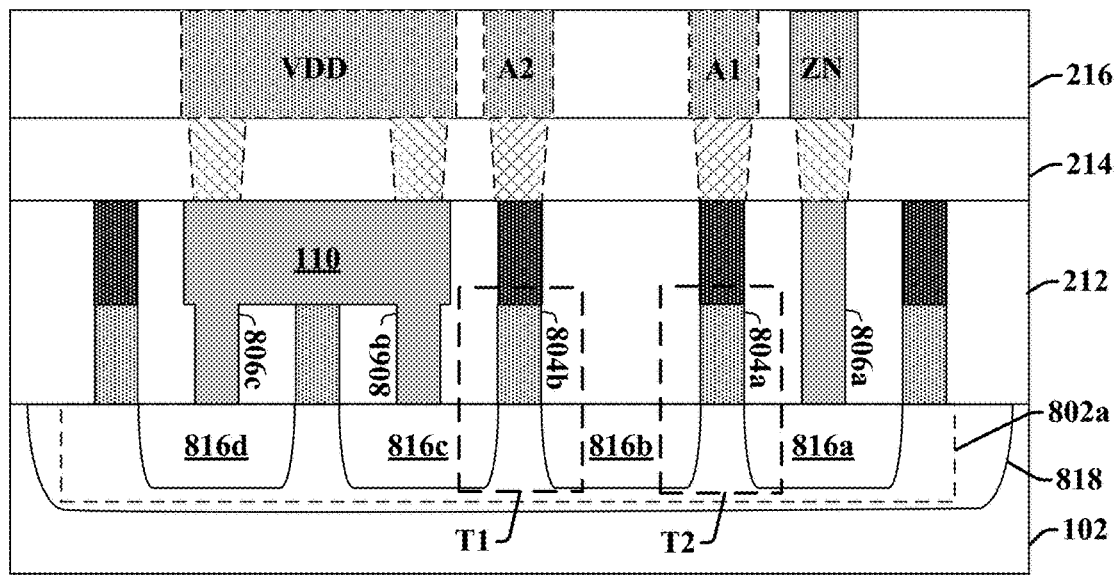

FIGS. 8A-8C illustrates some embodiments of a NOR gate having a power horn structure configured to reduce parasitic resistance.

As shown in top-view 800, the NOR gate comprises a first active area 802a and a second active area 802b. As shown in cross-sectional view 814 of FIG. 8C (along line A-A' of FIG. 8A), the first active area 802a comprises a plurality of source/drain regions 816a-816d having n-type doping. In some embodiments, the plurality of source/drain regions 816a-816d may be arranged within a well region 818 having p-type doping. The second active area 802b comprises a plurality of source/drain regions having p-type doping. In some embodiments, the first active area 802a and/or the second active area 802b may include at least one fin, protruding outward from a semiconductor substrate 102, to form FinFET transistors.

A first gate structure 804a and a second gate structure 804b extend over the first active area 802a to form a first PMOS transistor T1 and a second PMOS transistor T2 arranged in series between a first power rail 808a (illustrated as transparent to show the underlying layers) held at a source voltage $V_{DD}$ and an output pin ZN (as shown in schematic diagram 812 of FIG. 8B). The first gate structure 804a and the second gate structure 804b are coupled to input pins $A_1$ and $A_2$ configured to provide control signals to the first gate structure 804a and the second gate structure 804b, respectively. In some embodiments, the first power rail 808a, the output pin ZN, and the input pins $A_1$ and $A_2$ are arranged on a same BEOL metal wire layer (e.g., an 'M1' layer).

A first plurality of MEOL structures 806a-806b are arranged over the first active area 802a. The first plurality of MEOL structures comprise a first MEOL structure 806a coupled to the output pin ZN by a conductive contact 810 (to simplify the illustration, a single conductive contact 810 is labeled with a reference numeral in FIG. 8A). The first plurality of MEOL structures further comprise a second MEOL structure 806b and a third MEOL structure 806c, which extend from over the first active area 802a to under the first power rail 808a. The second MEOL structure 806b and the third MEOL structure 806c are coupled by a first conductive structure 812a that provides for parallel current paths between the first power rail 808a and the second MEOL structure 806b.

The first gate structure 804a and the second gate structure 804b also extend over the second active area 802b to form a first NMOS transistor T3 and a second NMOS transistor T4 arranged in parallel between the output pin ZN and a second power rail 808b held at ground voltage $V_{SS}$. A second plurality of MEOL structures 806d-806g are arranged over the second active area 802b. The second plurality of MEOL structures comprise a fourth MEOL structure 806d coupled to the output pin ZN by a conductive contact 810. The second plurality of MEOL structures further comprise a fifth MEOL structure 806e, a sixth MEOL structure 806f, and a seventh MEOL structure 806g, which extend from over the second active area 802b to under the second power rail 808b. The sixth MEOL structure 806f and the seventh MEOL structure 806g are coupled by a second conductive structure 812b that provides for parallel current paths between the second power rail 808b and the sixth MEOL structure 806f.

Figure 9:
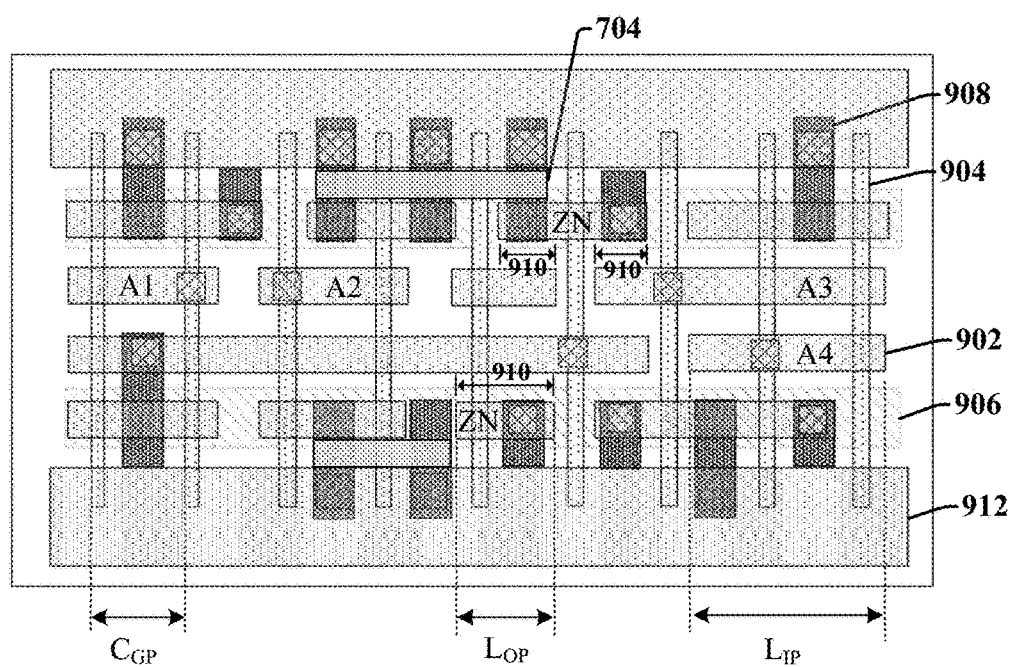
FIG. 9 illustrates a top-view of some embodiments of an integrated circuit having a power horn structure and output pins configured to reduce parasitic resistance and capacitance.

FIG. 9 illustrates a top-view of some embodiments of an integrated circuit 900 having a power horn structure and output pins configured to reduce parasitic capacitance.

The integrated circuit 900 comprises a plurality of input pins $A_1$-$A_4$. The plurality of input pins $A_1$-$A_4$ comprise wires on a metal interconnect layer 902. The input pins $A_1$-$A_4$ are configured to provide an input signal (e.g., an input voltage) to a gate structure 904 device that extends over an active area 906 of a transistor. The input signal controls operation of the gate structure 904 (i.e., controls a flow of charge carriers in the transistor devices). In some embodiments, the plurality of input pins $A_1$-$A_4$ may be arranged on a first metal interconnect layer (i.e., a lowest metal interconnect layer above MEOL structures 908). The integrated circuit 900 also comprises one or more output pins ZN comprising wires on the metal interconnect layer 902. The one or more output pins ZN are configured to provide an output signal (e.g., an output voltage) from a transistor device. In some embodiments, the one or more output pins ZN may be arranged on the first metal interconnect layer.

The one or more output pins ZN have relatively short length $L_{OP}$ which reduces an overlap 910 between the input pins $A_1$-$A_4$ and the one or more output pins ZN. Decreasing the overlap 910 between the one or more output pins ZN and the input pins $A_1$-$A_4$ decreases a parasitic capacitance of the integrated circuit 900. This is because the parasitic capacitance between adjacent metal interconnect wires is proportional to an overlap of the wires and a distance between the wires (i.e., C=A·D; where C is capacitance, A is an area of overlap between wires, and D is a distance between the wires).

In some embodiments the one or more output pins ZN may have a length $L_{OP}$ that is less than approximately 1.5 times the contact gate pitch $C_{GP}$ (i.e., a distance between same edges of adjacent gate structures 904). In some embodiments, a length $L_{OP}$ of the one or more output pins ZN is less than or equal to a length $L_H$ of the input pins $A_1$-$A_4$, thereby ensuring an overlap between the input pins $A_1$-$A_4$ and the one or more output pins ZN is on a single end of the output pins ZN. In some additional embodiments, the one or more output pins ZN may have a length $L_{OP}$ that is set by a minimum metal cut distance (i.e., a distance between cuts on a cut mask) in a self-align double patterning process.

In some embodiments, the one or more output pins ZN may be located along a wiring track that is between an input pin $A_1$-$A_4$ and a power rail 912 (e.g., held at a source voltage $V_{DD}$ or a ground voltage $V_{SS}$). In such embodiments, the one or more output pins ZN may overlap an input pin $A_1$-$A_4$ along one side but not both, thereby reducing a parasitic capacitance between the one or more output pins ZN and the output pins $A_1$-$A_4$.

FIGS. 10-17 illustrate some embodiments of a method of forming an integrated circuit having a power horn structure.

As shown in cross-section view 1000, a semiconductor substrate 102 is provided. The semiconductor substrate 102 may be any type of semiconductor body (e.g., silicon, SiGe, SOI) such as a semiconductor wafer and/or one or more die on a wafer, as well as any other type of metal layer, device, semiconductor and/or epitaxial layers, etc., associated therewith. The semiconductor substrate 102 may comprise an intrinsically doped semiconductor substrate having a first doping type (e.g., an n-type doping or a p-type doping).

In some embodiments, a well region 202 may be formed within the semiconductor substrate 102. The well region 202 may be formed by implanting the semiconductor substrate 102 with a dopant species 1002 having a second doping type that is opposite the first doping type of the semiconductor substrate 102 (e.g., a p-type substrate may be implanted with an n-type dopant, or vice versa). In some embodiments, the well region 202 may be formed be implanting the dopant species 1002 into the semiconductor substrate 102 according to a first masking layer 1004 (e.g., a photoresist layer).

As shown in cross-sectional view 1100, a plurality of gate structures 106a-106b are formed over the semiconductor substrate 102. The plurality of gate structures my comprise an electrically active gate structure 106a arranged between a first source/drain region 204a and a second source/drain region 204b, and a dummy gate structure 106b arranged between the second source/drain region 204b and a third source/drain region 204c. The plurality of gate structures 106a-106b may be formed by forming a gate dielectric layer 208 onto the semiconductor substrate 102 and forming a gate electrode layer 210 over the gate dielectric layer 208. The gate dielectric layer 208 and the gate electrode layer 210 are subsequently patterned according to a photolithography process to form the plurality of gate structures, 106a-106b.

Source/drain regions, 204a-204c, may be formed within the semiconductor substrate 102 on opposing sides of the plurality of gate structures 106a-106b. In some embodiments, the source/drain regions, 204a-204c may be formed by an implantation process that selectively implants the semiconductor substrate 102 with a dopant species 1102 having the first doping type. The implantation process may use the plurality of gate structures 106a-106b and a second masking layer 1104 to define the source/drain regions, 204a-204c. In some embodiments, the second masking layer 1104 may be the same as the first masking layer 1004. The dopant species 1102 may be subsequently driven into the semiconductor substrate 102 by a high temperature thermal anneal. In other embodiments, the source/drain regions, 204a-204c, may be formed by etching the semiconductor substrate 102 and then performing an epitaxial process.

As shown in cross-sectional view 1200, a first ILD layer 1202 is formed over the semiconductor substrate 102. In various embodiments, the first ILD layer 1202 may comprise an oxide, an ultra-low k dielectric material, or a low-k dielectric material (e.g., SiCO). The first ILD layer 1202 may be formed by a deposition process (e.g., CVD, PE-CVD, ALD, PVD, etc.).

The first ILD layer 1202 is subsequently patterned to form one or more openings 1204. In some embodiment, the first ILD layer 1202 may be patterned by forming a third masking layer 1206 over the first ILD layer 1202, and subsequently exposing the first ILD layer 1202 to an etchant 1208 in areas not covered by the third masking layer 1206. In some embodiments, the third masking layer 1206 may comprise a photoresist layer having a pattern defined by a photolithography process. In various embodiments, the etchant 1208 may comprise a dry etchant (e.g., a plasma etch with tetrafluoromethane ($CF_4$), sulfur hexafluoride ($SF_6$), nitrogen trifluoride ($NF_3$), etc.) or a wet etchant (e.g., hydroflouric (HF) acid).

As shown in cross-sectional view 1300, a plurality of MEOL structures 108a-108c are formed within the openings 1204 in the first ILD layer 1202. The plurality of MEOL structures may comprise a first MEOL structure 108a arranged over a first source/drain region 204a, a second MEOL structure 108b arranged over a second source/drain region 204b, and a third MEOL structure 108c arranged over a third source/drain region 204c. The plurality of MEOL structures 108a-108c may comprise a conductive material such as aluminum, copper, and/or tungsten, for example. The plurality of MEOL structures 108a-108c may be formed by a deposition process and/or a plating process. In some embodiments, a deposition process may be used to form a seed layer within the one or more openings 1204, followed by a subsequent plating process (e.g., an electroplating process, an electro-less plating process) that forms a metal material to a thickness that fills the one or more openings 1204. In some embodiments, a chemical mechanical polishing (CMP) process may be used to remove excess of the metal material from a top surface of the first ILD layer 1202.

As shown in cross-sectional view 1400, a conductive structure 110 is formed within a second ILD layer 1402 arranged over the first ILD layer 1202. The conductive structure 110 is arranged over the second MEOL structure 108b and the third MEOL structure 108c. The conductive structure 110 has a lower surface that contacts an upper surface of the second MEOL structure 108b. In some embodiments, the lower surface of the conductive structure 110 also contacts an upper surface of a dummy gate structure 106b and/or the third MEOL structure 108c. In some embodiments, the conductive structure 110 is formed by etching the second ILD layer 1402 to form an opening and subsequently forming a conductive material within the opening.

As shown in cross-sectional view 1500, a plurality of conductive contacts 112a-112d are formed in a first IMD layer 214. The plurality of conductive contacts 112a-112d may be formed by etching the first IMD layer 214 to form a plurality of openings. A conductive material (e.g., tungsten) is then formed within the plurality of openings.

As shown in cross-sectional view 1600 and top-view 1604, a BEOL metal interconnect layer is formed over the plurality of conductive contacts 112a-112d. The BEOL metal interconnect layer comprises an input pin 1602a coupled to the active gate structure 106a by a second conductive contact 112b, an output pin 1602b coupled to the first MEOL structure 108a by a first conductive contact 112a, and a power rails 1602c electrically coupled to the second MEOL structure 108b by a third conductive contact 112c and a fourth conductive contact 112d. In some embodiments, the third and fourth conductive contacts, 112c and 112d, are arranged along an upper surface of the second and third MEOL structures, 108b and 108c, respectively. In other embodiments, the third and fourth conductive contacts, 112c and 112d, are arranged along an upper surface of the conductive structure 110.

As shown in top-view 1700, the input pin 1602a and/or the output pins, 1602b and 1602d, are selectively cut to reduce a length of the input pin 1602a and/or the output pins, 1602b and 1602d. For example, as shown in top-view 1700, a length of output pin 1602b is reduced from $L_{OP}'$ to $L_{OP}$. In some embodiments, a cut mask may be used to reduce a length of the input pin 1602a and the output pins, 1602b and 1602d. The cut mask has a plurality of cut regions 1704, which 'cut' the input pin 1602a and the output pins, 1602b and 1602d, by removing metal material from selective areas of a metal layer comprising the input pin 1602a and the output pins, 1602b and 1602d.

In some additional embodiments, the cut regions 1704 are separated by a minimum metal cut distance, so that the output pin 1702d has a length $L_{OP}$ that is set by the minimum metal cut distance. For example, in some embodiments the output pin 1702d may have a length $L_{OP}$ that is less than approximately 1.5 times the contact gate pitch $C_{GP}$ (i.e., a distance between same edges of adjacent gate structures 904). In some additional embodiments, a length $L_{OP}$ of the output pin 1702d is less than or equal to a length $L_{HP}$ of the input pin 1702a, thereby ensuring an overlap between the input pin 1702a and the output pin 1702d is on a single end of the output pin 1702d.

Figure 18:
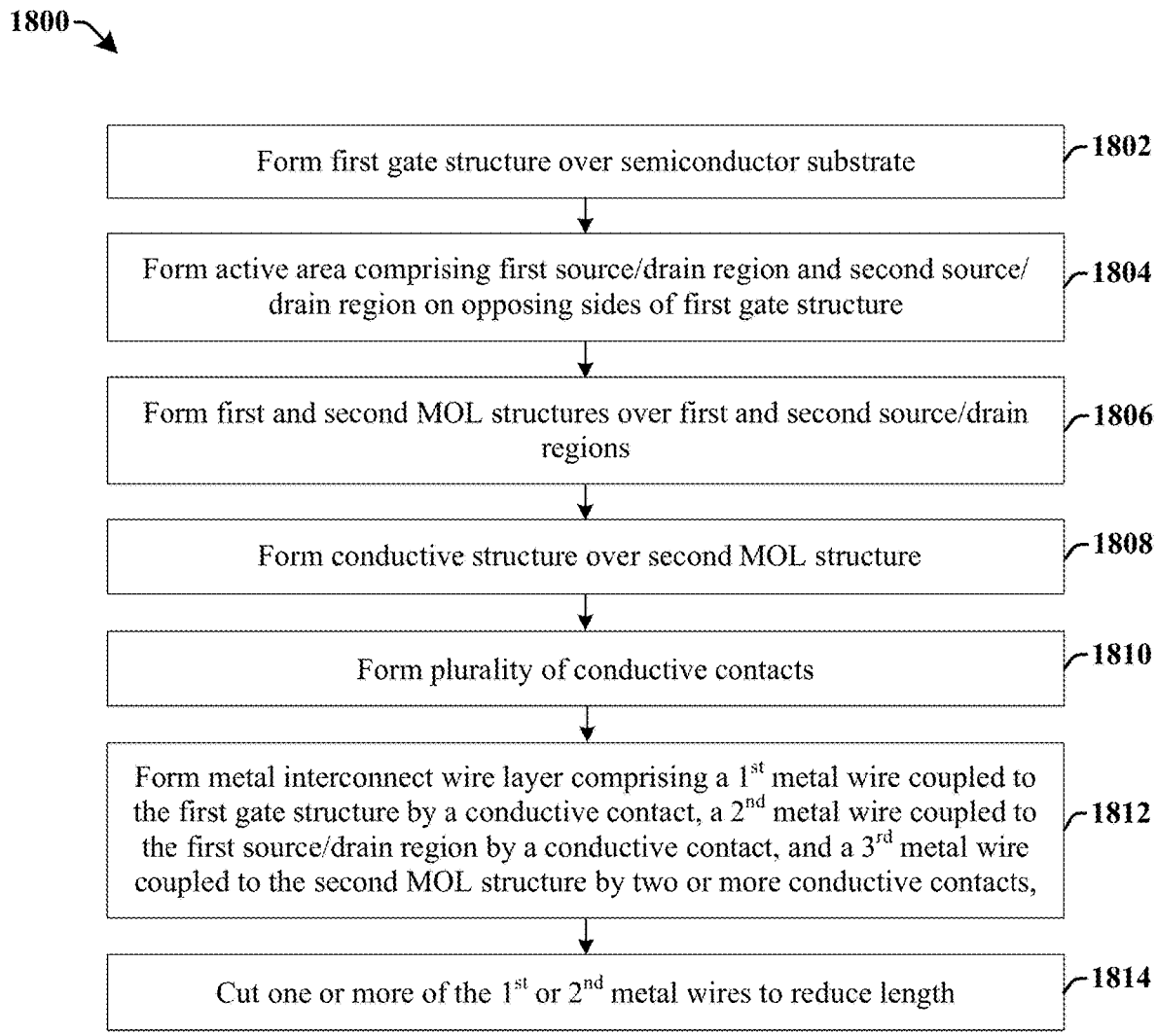
FIG. 18 illustrates a flow diagram of some embodiments of a method of forming an integrated circuit having a power horn structure configured to reduce parasitic resistance.

FIG. 18 illustrates a flow diagram of some embodiments of a method 1800 of forming an integrated circuit having a power horn structure configured to reduce parasitic resistance.

While the disclosed method 1800 is illustrated and described herein as a series of acts or events, it will be appreciated that the illustrated ordering of such acts or events are not to be interpreted in a limiting sense. For example, some acts may occur in different orders and/or concurrently with other acts or events apart from those illustrated and/or described herein. In addition, not all illustrated acts may be required to implement one or more aspects or embodiments of the description herein. Further, one or more of the acts depicted herein may be carried out in one or more separate acts and/or phases.

Figure 11:
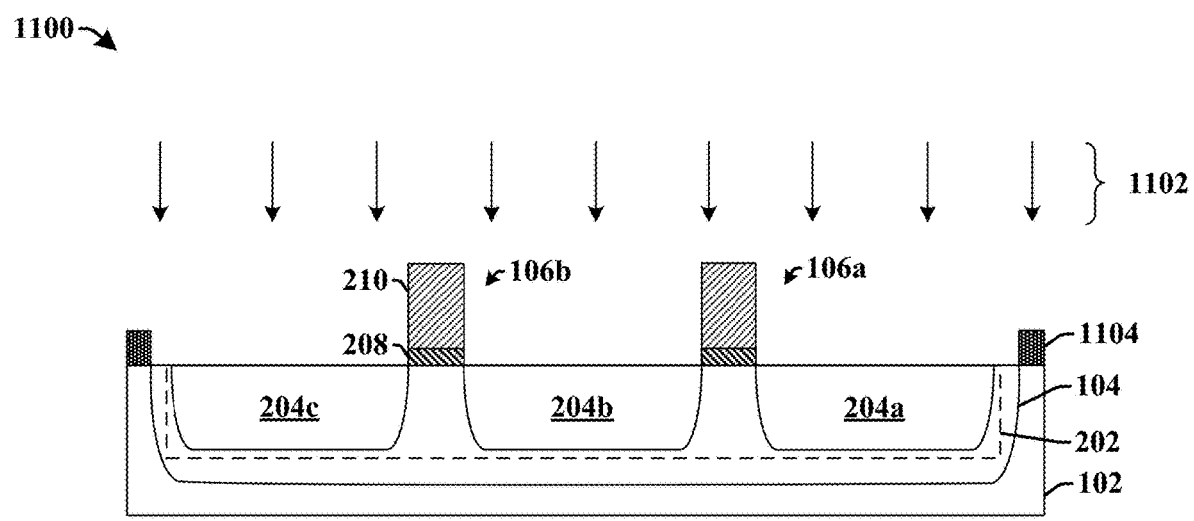

At 1802, a first gate structure is formed over a semiconductor substrate. In some embodiments, the first gate structure may comprise one of a plurality of gate structures are formed over a semiconductor substrate at a substantially regular pitch. FIG. 11 illustrates some embodiments corresponding to act 1802.

Figure 10:
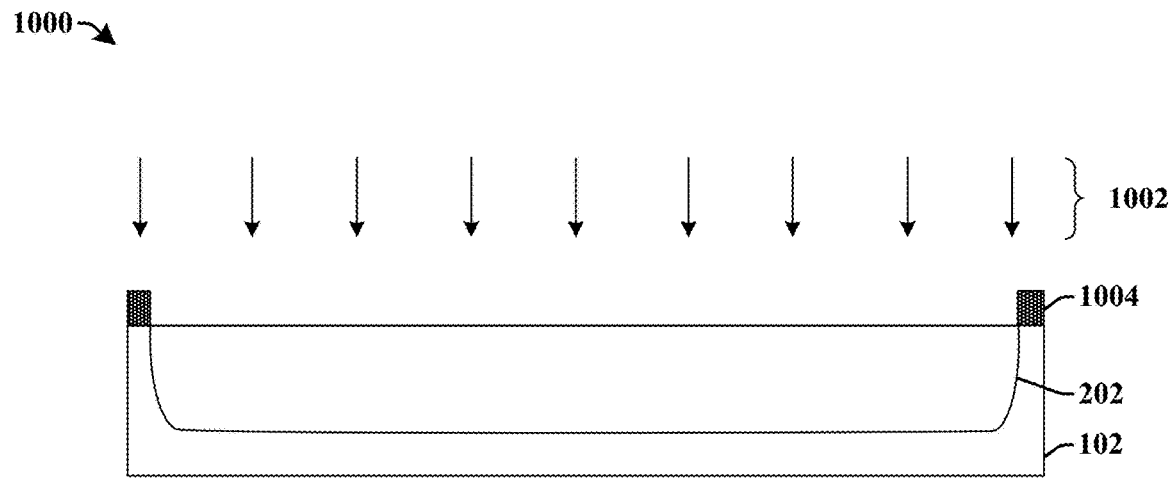
FIGS. 10, 11, 12, 13, 14, 15, 16A, 16B, 17 illustrate some embodiments of a method of forming an integrated circuit having a power horn structure.

At 1804, an active area is formed. The active area comprises a first source/drain region and a second source/drain region formed on opposing sides of a first one of the plurality of gate structures. In some embodiments, the active area may include at least one fin, protruding outward from the semiconductor substrate, to form FinFET transistors. FIGS. 10-11 illustrate some embodiments corresponding to act 1804.

Figure 12:
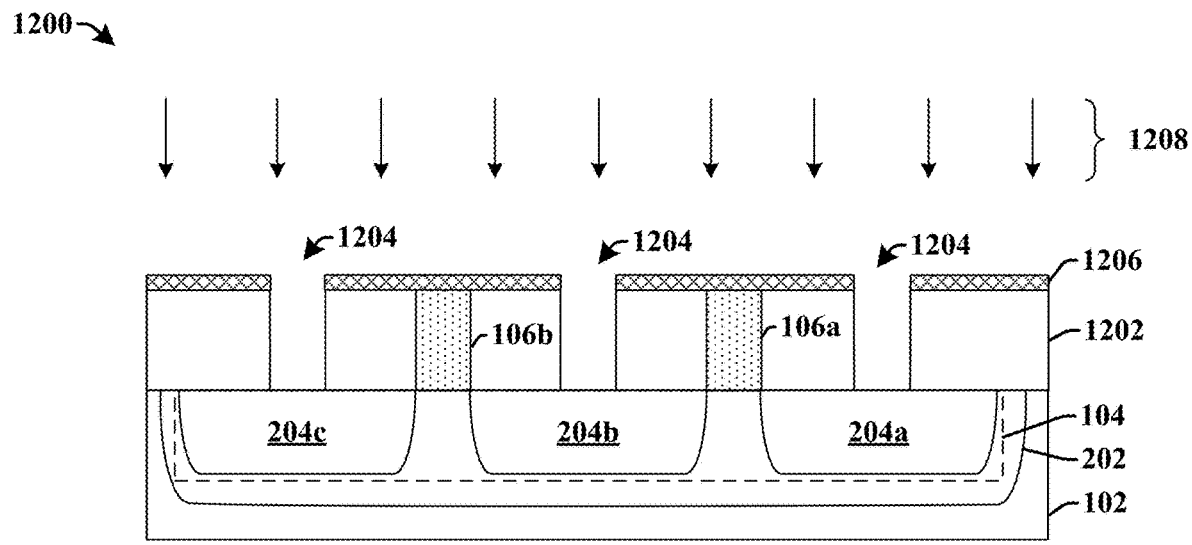
Figure 13:
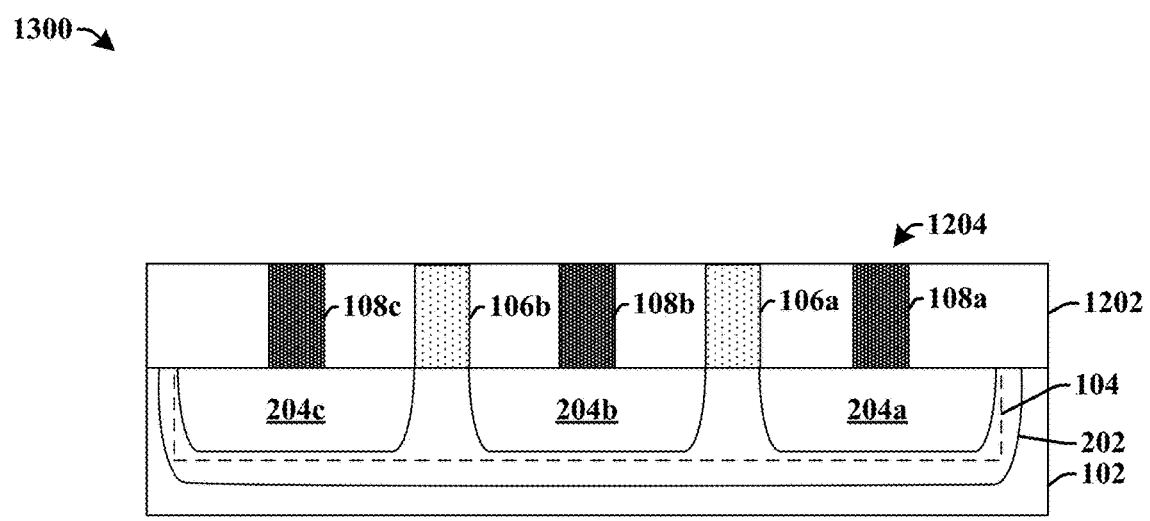

At 1806, first and second MEOL structures are formed over the first and second source/drain regions, respectively. FIGS. 12-13 illustrate some embodiments corresponding to act 1806.

Figure 14:
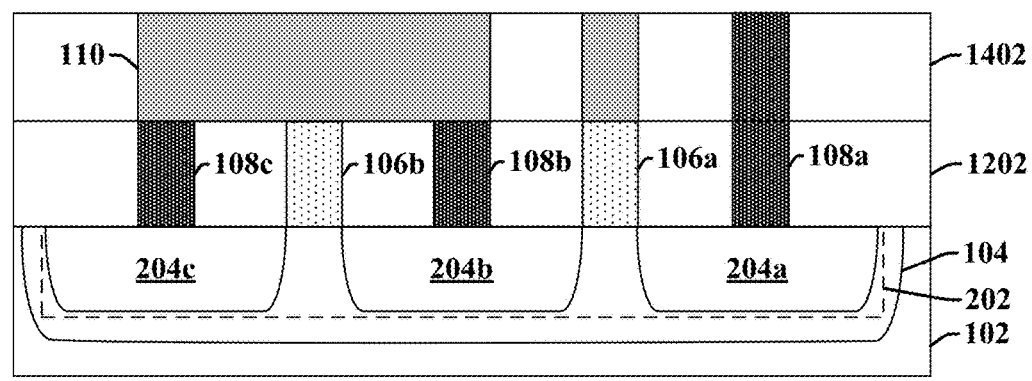

At 1808, a conductive structure is formed over the second MEOL structure. FIG. 14 illustrates some embodiments corresponding to act 1808.

Figure 15:
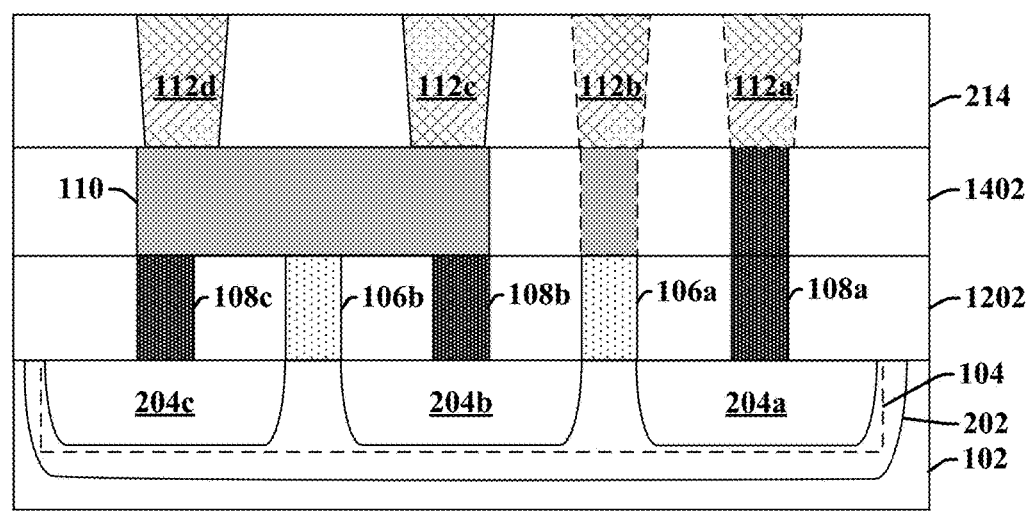

At 1810, a plurality of conductive contacts are formed over the MEOL structures and the plurality of gate structures. FIG. 15 illustrates some embodiments corresponding to act 1810.

Figure 16A:
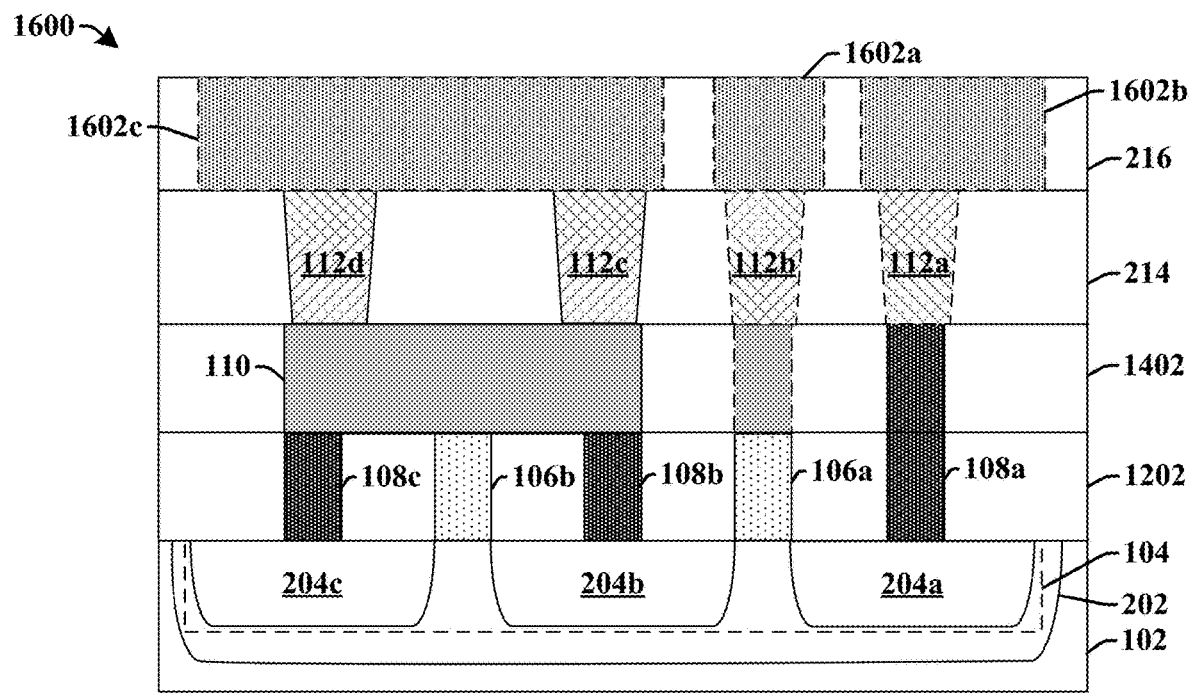
Figure 16B:
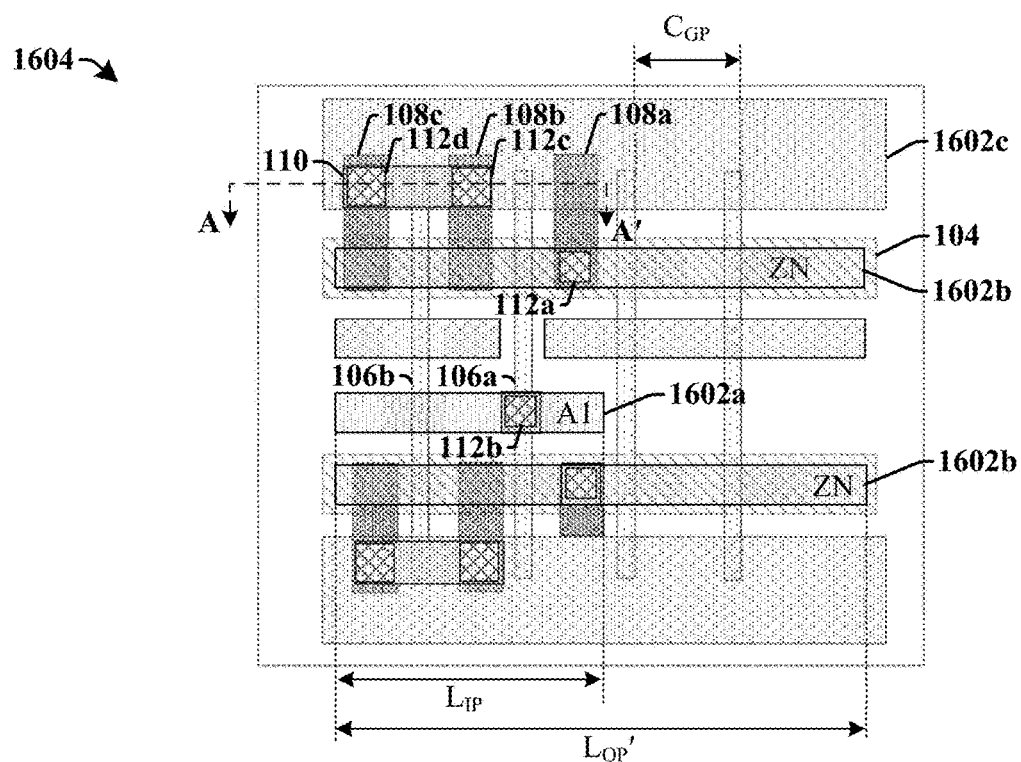

At 1812, a metal interconnect layer is formed. The metal interconnect wire layer comprises a first metal wire coupled to the first gate structure by a conductive contact, a second metal wire coupled to the first source/drain region by a conductive contact, and a third metal wire electrically coupled to the second MEOL structure by two or more conductive contacts. FIG. 16A-16B illustrates some embodiments corresponding to act 1812.

Figure 17:
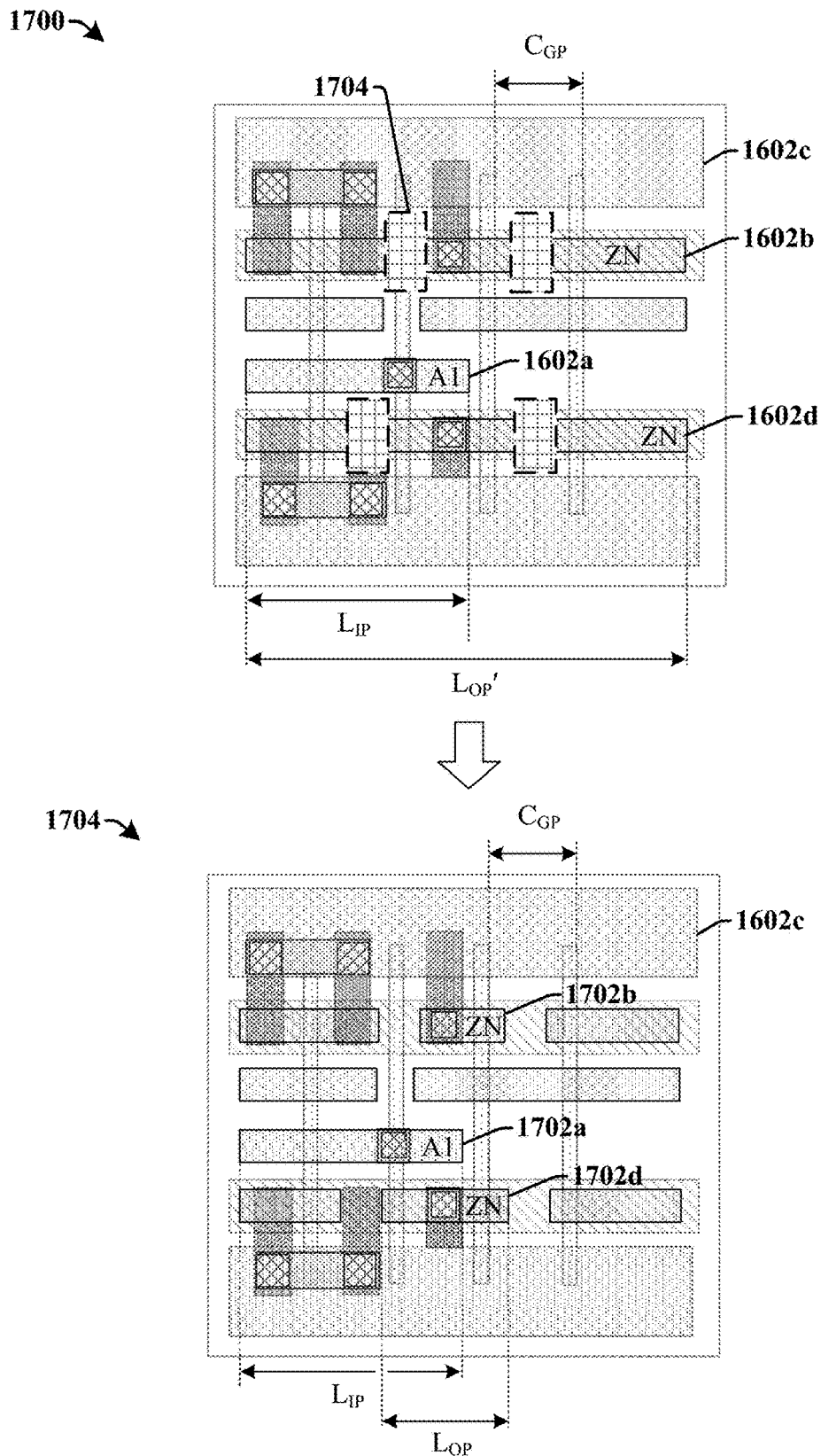

At 1814, one or more of the first or second metal wires are cut to reduce lengths of the one or more of the first or second metal wires. FIG. 17 illustrates some embodiments corresponding to act 1814.

Therefore, the present disclosure relates to an integrated circuit having parallel conductive paths between a BEOL interconnect layer and a MEOL structure, which are configured to reduce a parasitic resistance and/or capacitance of an integrated circuit.

In some embodiments, the present disclosure relates to an integrated circuit. The integrated circuit comprises a first source/drain region and a second source/drain region arranged within a semiconductor substrate and separated by a channel region. A gate structure is arranged over the channel region, and a middle-end-of-the-line (MEOL) structure arranged over the second source/drain region. A conductive structure is arranged over and in electrical contact with the MEOL structure. A first conductive contact is vertically arranged between the MEOL structure and a back-end-the-line (BEOL) interconnect wire, and a second conductive contact configured to electrically couple the BEOL interconnect wire and the MEOL structure along a conductive path extending through the conductive structure.

In other embodiments, the present disclosure relates to an integrated circuit. The integrated circuit comprises a first gate structure extending over an active area in a first direction. The active area comprises a first source/drain region and a second source/drain region disposed within a semiconductor substrate. A first MEOL structure and a second MEOL structure are arranged on opposite sides of the first gate structure. The first MEOL structure extends over the first source/drain region and the second MEOL structure extends over the second source/drain region in the first direction. A conductive structure is arranged over and in electrical contact with the second MEOL structure. A first conductive contact is arranged over the second MEOL structure and below a metal power rail extending in a second direction perpendicular to the first direction. A second conductive contact configured to electrically couple the metal power rail and the second MEOL structure along a conductive path extending through the conductive structure.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

In yet other embodiments, the present disclosure relates to a method of forming an integrated circuit. The method comprises forming a first gate structure over a semiconductor substrate. The method further comprises forming a first source/drain region and a second source/drain region on opposing sides of the first gate structure. The method further comprises forming a first MEOL structure onto the first source/drain region and a second MEOL structure onto the second source/drain region. The method further comprises forming a conductive structure on and in direct contact with the second MEOL structure. The method further comprises forming a BEOL metal interconnect wire coupled to the second MEOL structure by a first conductive path extending through a first conductive contact arranged over the second MEOL structure and by a second conductive path extending through the conductive structure.

What is claimed is:

1. A method of forming an integrated circuit, comprising:
   forming a gate structure over a substrate;
   selectively implanting the substrate to form a first source/drain region and a second source/drain region on opposing sides of the gate structure;
   forming a first middle-end-of-the-line (MEOL) structure on the first source/drain region and a second MEOL structure on the second source/drain region, wherein the first MEOL structure has a bottommost surface that extends as a continuous surface in a first direction from directly over the first source/drain region to laterally past an outermost edge of the first source/drain region;
   forming a conductive structure contacting the first MEOL structure and the second MEOL structure, wherein the conductive structure laterally extends from directly over the first MEOL structure to directly over the second MEOL structure along a second direction perpendicular to the first direction; and
   forming a conductive contact over the second MEOL structure, wherein the conductive contact and the conductive structure directly contact different locations on an upper surface of the second MEOL structure.

2. The method of claim 1, wherein the conductive structure has a flat bottommost surface that continually extends between a first point directly contacting an upper surface of the gate structure and a second point directly contacting an upper surface of the first MEOL structure.

3. The method of claim 1, further comprising:
   forming a second gate structure separated from the gate structure by the first source/drain region, wherein a horizontal plane parallel to an upper surface of the substrate extends through sidewalls of the conductive structure and through sidewalls of a second conductive contact arranged on the second gate structure.

4. The method of claim 1, wherein the first MEOL structure and the second MEOL structure have uppermost surfaces that laterally extend along the first direction past opposing sidewalls of the conductive structure.

5. The method of claim 1,
   forming an inter-level dielectric (ILD) layer over the substrate;
   selectively etching the ILD layer to form sidewalls of the ILD layer that define an opening continuously extending from directly over the first MEOL structure to directly over the second MEOL structure; and
   forming a conductive material within the opening to form the conductive structure.

6. The method of claim 1, wherein the gate structure comprises a different material than the first MEOL structure and the second MEOL structure.

7. The method of claim 1, further comprising:
   forming an additional conductive contact over the first MEOL structure, wherein both the conductive structure and the additional conductive contact physically contact an upper surface of the first MEOL structure.

8. The method of claim 1, wherein an outermost edge of the second source/drain region is laterally between the gate structure and a sidewall of the second MEOL structure facing the gate structure.

9. The method of claim 1, wherein the gate structure comprises a gate electrode vertically separated from the substrate by a gate dielectric.

10. The method of claim 1, wherein the gate structure comprises a gate dielectric and a gate electrode contacting a top of the gate dielectric, the gate electrode defining a topmost surface of the gate structure.

11. A method of forming an integrated circuit, comprising:
    forming a first gate structure over a substrate;
    selectively implanting the substrate to form a first source/drain region and a second source/drain region on opposing sides of the first gate structure;
    forming a first MEOL structure onto the first source/drain region and a second MEOL structure onto the second source/drain region;
    forming a conductive structure extending in a second direction from a first point on and in contact with the first MEOL structure to a second point on and in contact with the second MEOL structure, wherein the first MEOL structure and the second MEOL structure have uppermost surfaces that respectively extend as a continuous surface laterally past opposing outermost sidewalls of the conductive structure along a first direction, the first direction perpendicular to the second direction; and
    forming an interconnect wire coupled to the first MEOL structure by a first conductive path extending through a first conductive contact arranged over the first MEOL structure and by a second conductive path extending through the conductive structure.

12. The method of claim 11, wherein the first conductive contact and the conductive structure directly contact different locations along an upper surface of the first MEOL structure.

13. The method of claim 11, wherein the first source/drain region and the second source/drain region have a first doping type and are separated by a region of the substrate having a second doping type, the region of the substrate having the second doping type being directly between the first source/drain region and the second source/drain region and directly below the first gate structure.

14. The method of claim 11, wherein the second conductive path extends along the second direction.

15. A method of forming an integrated circuit, comprising:
- forming a first source/drain region and a second source/drain region on opposing sides of a first gate structure over a substrate;
- forming a first MEOL structure physically contacting the first source/drain region and a second MEOL structure physically contacting the second source/drain region;
- forming a conductive structure physically contacting the second MEOL structure;
- forming a first conductive contact over the second MEOL structure, wherein the first conductive contact and the conductive structure directly contact different locations along a flat upper surface of the second MEOL structure; and
- forming a conductive interconnect wire coupled to the second MEOL structure by a first conductive path extending through the first conductive contact and by a second conductive path extending through the conductive structure.

16. The method of claim 15,
wherein the second MEOL structure extends past an outermost edge of the second source/drain region along a first direction that is perpendicular to a line that is normal to an upper surface of the substrate; and
wherein the conductive structure extends past a sidewall of the second MEOL structure along a second direction that is perpendicular to both the first direction and the line that is normal to the upper surface of the substrate.

17. The method of claim 15, wherein a horizontal plane parallel to an upper surface of the substrate extends through sidewalls of the conductive structure and the first conductive contact.

18. The method of claim 15,
wherein the second MEOL structure continually extends in a first direction from directly over the second source/drain region to laterally past an outer edge of second source/drain region; and
wherein the conductive structure contacts the second MEOL structure at a point that is directly over the second source/drain region.

19. The method of claim 15, further comprising:
- forming a third MEOL structure on a third source/drain region separated from the second source/drain region by a second gate structure; and
- forming a second conductive contact over the third MEOL structure, wherein the second conductive contact has a bottom surface that is closer to the substrate than a top surface of the conductive structure.

20. The method of claim 15, wherein the first conductive contact is directly between a lower surface of the conductive interconnect wire and the second MEOL structure.

\* \* \* \* \*